(12) United States Patent
Lohneis

(10) Patent No.: US 8,845,117 B2
(45) Date of Patent: Sep. 30, 2014

(54) THREE-DIMENSIONAL LIGHTING STRUCTURE UTILIZING LIGHT ACTIVE TECHNOLOGY

(76) Inventor: Paul E. Lohneis, Potomac, MD (US)

( * ) Notice: Subject to any disclaimer, the term of this patent is extended or adjusted under 35 U.S.C. 154(b) by 6 days.

(21) Appl. No.: 13/421,921

(22) Filed: Mar. 16, 2012

(65) Prior Publication Data
US 2012/0224376 A1 Sep. 6, 2012

Related U.S. Application Data

(63) Continuation-in-part of application No. 12/423,567, filed on Apr. 14, 2009, now Pat. No. 8,210,697.

(60) Provisional application No. 61/045,070, filed on Apr. 15, 2008.

(51) Int. Cl.
| F21V 9/16 | (2006.01) |
| G09F 13/22 | (2006.01) |
| F21Y 105/00 | (2006.01) |
| F21Y 111/00 | (2006.01) |
| H01L 27/32 | (2006.01) |

(52) U.S. Cl.
CPC ............ *G09F 13/22* (2013.01); *F21Y 2105/008* (2013.01); *F21Y 2111/001* (2013.01); *H01L 2251/5338* (2013.01); *H01L 27/3202* (2013.01); *H01L 2251/5361* (2013.01); *F21Y 2105/006* (2013.01); *H01L 27/3237* (2013.01)
USPC ......................................... 362/84; 362/249.02

(58) Field of Classification Search
USPC .............. 362/84, 227, 235–238, 249, 249.02, 362/249.04, 249.06, 249.08, 249.09, 362/249.14, 249.16, 249.17, 249.18, 362/249.19, 806, 807, 811, 812; 40/410, 40/411, 427, 441, 442, 444, 552
See application file for complete search history.

(56) References Cited

U.S. PATENT DOCUMENTS

| 5,645,343 A | 7/1997 | Rinehimer |
| 5,857,765 A | 1/1999 | Deron |
| 6,045,575 A * | 4/2000 | Rosen et al. .................... 607/88 |

(Continued)

FOREIGN PATENT DOCUMENTS

| DE | 10350913 | 6/2005 |
| DE | 102006037998 | * 2/2008 |

(Continued)

OTHER PUBLICATIONS

EPO Search Report, EP 09733050, Sep. 7, 2012.

(Continued)

*Primary Examiner* — Hargobind S Sawhney

(57) ABSTRACT

A structure and method for three-dimensional lighting using light active technology. The structure has one or more non-rigid, flexible, foldable double-faced sheet of light active material formed of two opposedly facing sheets of light active material arranged back-to-back and configured to emit light from front and back sides of the at least one double-faced sheet of light active material. A collapsible three-dimensional lighting structure is formed of the double-faced sheet(s) of light active material and a folding element. A power supply element provides power to the circuitry and is coupled to the plurality of lighting elements of the two opposedly facing sheets of light active material. A fastening element coupled to the double-faced sheets of light active material at a fastening point removably retains the three-dimensional form.

25 Claims, 9 Drawing Sheets

(56) References Cited

U.S. PATENT DOCUMENTS

| | | | |
|---|---|---|---|
| 6,688,759 B1 | 2/2004 | Hadjimichael | |
| 6,801,185 B2* | 10/2004 | Salley | 345/102 |
| 6,811,563 B2* | 11/2004 | Savage et al. | 607/88 |
| 6,962,737 B2* | 11/2005 | Volfson | 428/38 |
| 6,998,772 B2* | 2/2006 | Terumoto | 313/504 |
| 7,364,315 B2* | 4/2008 | Chien | 362/84 |
| 7,622,861 B2* | 11/2009 | Oooka et al. | 313/504 |
| 2004/0070195 A1 | 4/2004 | Nelson et al. | |
| 2005/0082820 A1 | 4/2005 | Nelson et al. | |
| 2005/0188569 A1 | 9/2005 | Derose | |
| 2005/0248935 A1 | 11/2005 | Strip et al. | |
| 2008/0180949 A1* | 7/2008 | Liao et al. | 362/251 |

FOREIGN PATENT DOCUMENTS

| | | |
|---|---|---|
| DE | 202008002894 U1 * | 5/2008 |
| EP | 0458517 | 11/1991 |
| EP | 1367676 | 12/2003 |
| EP | 1367677 | 12/2003 |
| GB | 389110 | 3/1933 |
| GB | 2394109 | 4/2004 |
| JP | 08203669 A * | 8/1996 |
| JP | 08250279 A * | 9/1996 |
| JP | 2000197169 | 7/2000 |
| JP | 2005302387 A * | 10/2005 |
| TW | M315805 | 7/2007 |
| WO | WO 92/18964 | 10/1992 |
| WO | WO 03/023807 | 3/2003 |
| WO | WO 2005036935 A1 * | 4/2005 |
| WO | WO2008005610 | 1/2008 |

OTHER PUBLICATIONS

EPO, Extended European Search Report, EP 13159335.2, Apr. 3, 2014.

* cited by examiner

100

200

300

700

800

900

1100

1200

1300

THREE-DIMENSIONAL LIGHTING STRUCTURE UTILIZING LIGHT ACTIVE TECHNOLOGY

PRIORITY CLAIM

This application claims priority to U.S. patent application Ser. No. 12/423,567 filed Apr. 14, 2009, which claims priority to U.S. Provisional Patent Application No. 61/045,070 filed Apr. 15, 2008, both of which are hereby incorporated by reference.

Background

Existing lighting having miniature or light emitting diode (LED) technology employs rigid plastic frames to support two-dimensional shapes. These frames detract from the focus on the pattern and are bulky to store. Moreover, the frames used in current dimensional lighting are flat and therefore only support a two-dimensional ornament, thereby not providing a lighted three-dimensional user experience. This rigidity also denies flexibility in the number or quality of shapes that are available.

Existing miniature light technology furthermore has an operational life that is limited. Power load increases occur when one or more bulbs burn out and must be borne by the remaining lights until the entire circuit burns out at once, leaving a useless lighting fixture in which the problem bulb or bulbs are difficult to identify and replace. Additionally, such conventional lighting is notorious for using considerable power and generating considerable heat.

There therefore exists in the art a need for dimensional lighting that is three-dimensional, non-bulky, easy to store, flexible, and resilient to individual power outages.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

Figure 1:
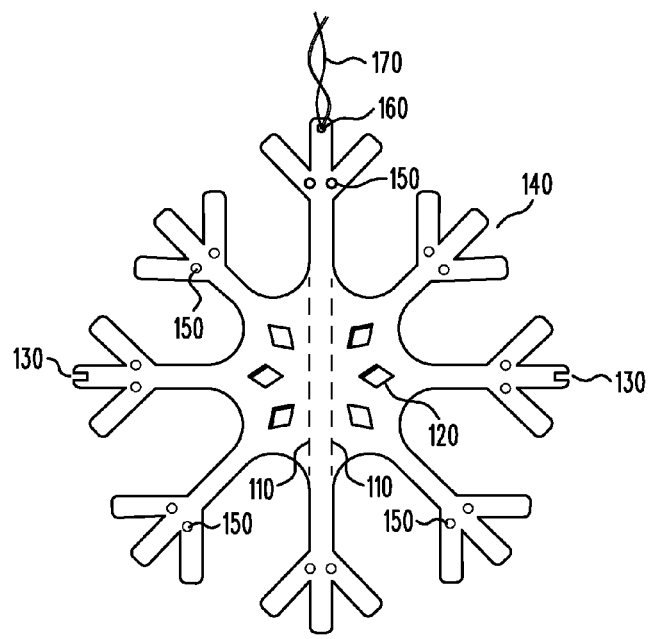
FIG. 1 is a front view of a three-dimensional lighting structure in accordance with certain embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment", "certain embodiments", "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with various embodiments, three-dimensional lighting structures, employing light active technology and arranged in one or more three-dimensional shapes, such as stars, balls, snowflakes, diamonds, and the like, which may or may not be geometrically patterned (geo-pattern), are disclosed. Such light active technology may be arranged in sheet or string format and includes organic light emitting diode (OLED) and inorganic light emitting diode (ILED) lighting technology. OLED technology employs organic compounds that are deposited, such as in rows and columns, as a film onto a flat carrier by a printing process. The resulting pixels of the organic compounds form an emissive electroluminescent layer that can emit light of varying colors. ILED technology uses inorganic materials.

The ease with which some light active technology may be folded, cut and shaped provides for lighting structures to be given a three-dimensional presentation in shape when used and then easily folded for ready storage in accordance with various embodiments. The durability of light active technology material provides for durable construction that can be used indoors or outdoors, and can be reused a number of times. The long lighting life associated with light active technology, such as OLED, is also attractive. Using this technology, the "support" framing that might otherwise be needed for decorative lighting can be minimized while still enjoying the longevity associated with light active technology.

The various embodiments described herein accord several advantages over non-three dimensional lighting. Other geo-dimensional lighting uses rigid plastic frames to support either miniature light strings or LED light strings, for example, in a flat, two-dimensional arrangement, and these frames detract from focus on the pattern and are bulky to store. The use of a rigid support structure does not provide for anything but a flat, two-dimensional lighting apparatus. This is quite different from the three-dimensionality of the lighting structure supported by the collapsible, non-rigid and non-bulky frame of the various embodiments described herein-a clear improvement in the art. Three-dimensional lighting, as opposed to a simply flat, two-dimensional, is achieved. The degree of three-dimensionality achieved is somewhat dependant on the number of sheets or plies of light active technology used or the intricacy of folding of one or more sheets of light active technology employed to render a three-dimensional form, which may be in a geometrical-pattern (geo-pattern) form though this is not required. As shown in the figures, and discussed below, the three-dimensional lighting may have multiple sheets of light active technology material that can be opened, or fanned open from closed, relatively flat closed storage, similar to the un-illuminated tissue paper balls, or it may be comprised of one sheet of light active technology material. For example, a three-dimensional structure may be achieved by fan folding a single sheet of active lighting material. As used herein, a sheet or ply of light active material refers to a single formed sheet containing an emissive electroluminescent layer composed of a film of organic compounds (in the case of OLED) or a film of inorganic compounds (in the case of ILED). A sheet or ply of light active technology material may be comprised of lighting of only one color, or it may be comprised of various sections of varying colors; consider the red, white and blue colors of a flag, for instance, in a single sheet.

The three-dimensional decorative lighting disclosed herein does not have a structural frame and is collapsible into a flat shape for easy storage.

Light active technology, sometimes referred to herein as active lighting material, provides advantages in the embodiments herein. The use of active lighting characterized as being permanently embossed between sandwich layers and therefore virtually flat, means that there are no obtrusive bumps or encapsulated lights to interfere with the simplicity of the sheet or to be damaged by some sort of impact on the lighting structure itself. Moreover, there is a considerably longer light life associated with light active technology, vastly longer than that associated with regular LED lights and particularly current mini-lights often used in decorative lighting. Current decorative lighting suffers from increased power loading when individual bulbs in a strand burn out, i.e., the reduced resistance causes an increase in the wattage to the remaining lights. In time, the power load becomes so high that all of the remaining lights burn out at once. And, in the case of OLED, in which arrangement of each of the OLED light pixels is in parallel, power overload is mitigated.

The use of light active technology in multi-dimensional lighting allows for greater flexibility in selection and arrangement of shapes. Whereas conventional lighting uses fixed wiring that is generally limited to a small number, such as three to nine, homogeneous shapes, the three-dimensional decorative lighting has "power" strings of various lengths that are electrified in parallel and accordingly has multiple attachment points (sockets) so that the user can mix a virtually unlimited number of geo-shapes at his choosing and can skip sockets without having blank (unlit) sections.

Light active technology further provides considerable power savings, using considerably less power than current mini-lights and LED lights. It also produces significantly less heat than either of the conventional alternatives.

Three-dimensional dimensional lighting may be manufactured from plastic laminates having active lighting and is formed from one or more sheet plies of light active technology, such as by die pressing, die cutting, or other mechanical, heat, or light (e.g. laser) means, that are folded, secured or otherwise arranged into one or more three-dimensional arrangements to produce one or more desired three-dimensional shapes. The edges of the plies of the light active material can be sealed in order to protect, as necessary, the diode lighting and powering circuitry within. Sheet edges may be sealed by heat, light (e.g. laser), mechanical techniques, such as die-pressing, die-cutting under pressure, an adhesive, such as a silicon based bonding agent, that may be applied by a sealant gun after the edges are formed. Such treatment not only permits the three-dimensional lighting to be used in inclement weather but to also be directly subjected to submersion conditions if desired.

As shown in FIG. 1, a front view of an unopened three-dimensional lighting structure 100 is seen, in which only one sheet of light active material is visible. The shape is that of a snowflake as indicated by shaped portions 140 but many shapes may be used, as previously discussed. The three-dimensional shape has one or more folding elements, shown here as mid-line creases 110 (indicated by the dashed lines of FIG. 1), holes and/or perforations 120 to facilitate expansion from a flat (storage) shape to the three dimensional shape. The edges of the three-dimensional shapes in this embodiment will have slots 130 for the insertion of a fastening element (such as bead chain 210, for example, of FIG. 2) that will hold the light active sheets in the three dimensional shape; such slots are illustrated at the tips at either end of the horizontal axis of the three-dimensional structure. The sheets will vary in number depending on the degree of light production, size and three dimensionality desired. The sheets may be heat or laser welded, or otherwise formed along the ornament's folding elements, such as a midline, by these folding element retention elements to provide a hinge point. The light active sheets, in some applications, will be mechanically attached along the midline folding element by appropriate folding element retention elements such as stainless steel staples or glue. A hole 160, illustrated at the top of the three-dimensional lighting structure, is provided for hanging using wire, monofilament, hooks, etc. and may be reinforced if necessary by brass or other material. A power supply element, such as power cord 170, shown at the top of the ornament 100, provides electrical power to the discrete lighting elements of the light active technology material, whether they be OLEDs or ILEDs, for example. In FIG. 1, the discrete lighting elements of the light active technology material are denoted by reference number 150.

A three-dimensional decorative lighting may be fixed, variable or both. Fixed three-dimensional dimensional lighting has a fixed number of consistent three-dimensional shapes permanently attached to a power feed line, such as the power cords evidenced in FIGS. 1-5. Variable dimensional lighting will utilize separately selected shapes that are plugged into multiple power sockets of a "power string" (various lengths). For either type, self-adhesive type fasteners (such as Velcro®) may be used to suspend the power cord on surfaces. These fasteners facilitate the removal of the power cord when the three-dimensional lighting structure is un-installed.

The three-dimensional lighting structure's laminate materials may be clear, opaque or colored (totally or in selected spots) to provide variety. Various power, timer, programmable (such as phased/sequenced), remote switch, etc. illumination arrangements may be optionally employed as desired. Such arrangements may be remotely controlled by programmable means, such as firmware, controller, and computer. The power supply element(s) described herein may be provided with power by any number of power sources, including, but not limited to, DC power, AC power, battery power, solar power, low voltage transformer, back-up supplies, or any combination thereof.

Figure 2:
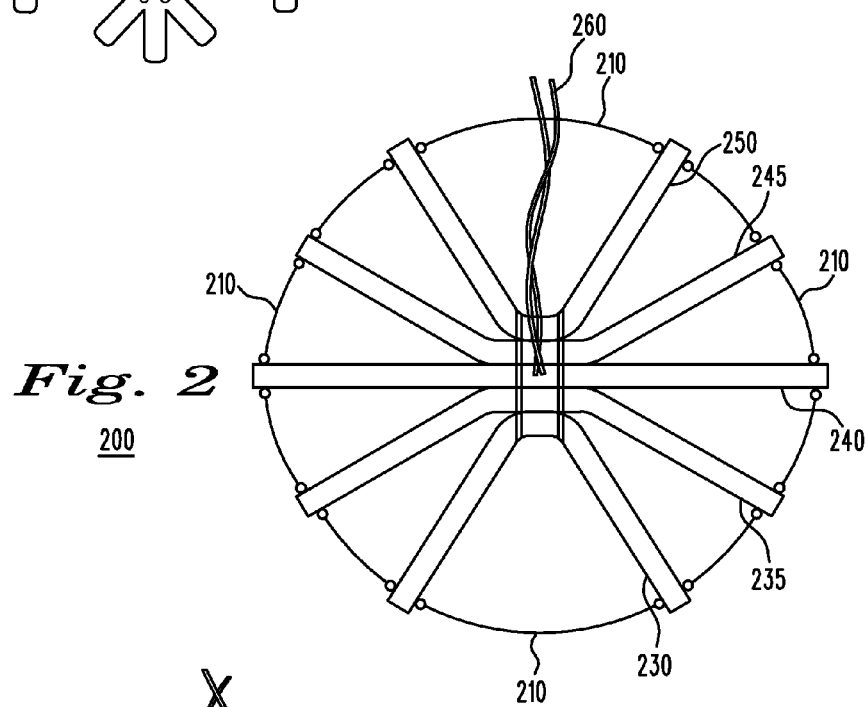
FIG. 2 is a top view of a three-dimensional lighting structure assembly in accordance with certain embodiments.

FIG. 2 is a top view of a three-dimensional lighting structure 200 in accordance with certain embodiments. In this view, an opened, fully three-dimensional ornament has folding mechanisms or elements 220, such as creases, slots, perforations at the appropriate point of the sheets of light active material 230, 235, 240, 245, 250 and employs a shape maintainer, referred to as a fastening element, such as a molded beaded "chain" 210, around the peripheral of the three-dimensional structure. The flexibility of sheets 230, 235, 245, 250 can be easily seen and contribute greatly to the pliability and three-dimensional nature of the three-dimensional ornament; while sheet 240 is substantially planar and may also be substantially rigid to lend structural support to the three-dimensional lighting structure, other sheets are easily shaped to the desired ornament shape. The sheets 230, 235, 240, 245, 250 may be affixed to each other by means of a folding element retention element such as by using a heat seal or weather-resistant fasteners, such as made of brass or stainless steel, for example. While the use of folding mechanisms/elements is apparent along the mid-line of the plies in this figure, this is by way of example only and not limitation. For example, other three-dimensional shapes, such as a box-kite arrangement may utilize folds/creases other than along the mid-line of its plies of light active material. Power cord 260 is used to provide power to the plies of light active material.

Figure 3:
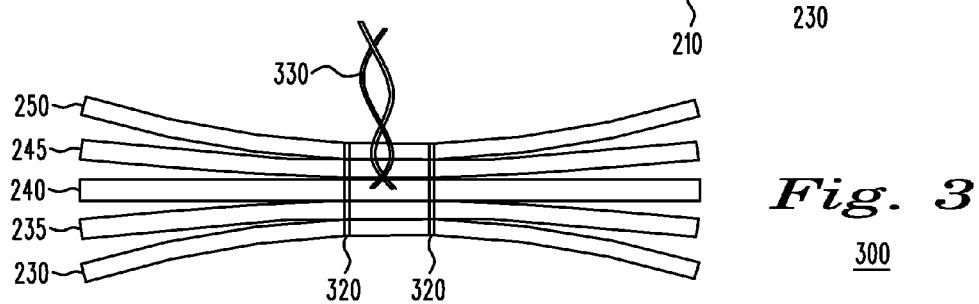
FIG. 3 illustrates storage of a three-dimensional lighting structure in accordance with certain embodiments.

FIG. 3 illustrates storage of a three-dimensional lighting structure 300 in accordance with certain embodiments. This top view of structure 300 shows that the structure may be collapsed (after removal of the beaded "chain" shape maintainer/fastening element of FIG. 2, for example) and sandwiched down into a smaller version for storage, due to the use of flexible active lighting and the corresponding absence of a rigid frame structure. The folding element creases 320, perforations at the center of the structure, are the locations at which folding of the sheets 230, 235, 245, 250 occurs, and are still visible, as indicated by the parallel, vertical lines shown in the center. Power cord 330 is used to provide power to the plies of light active material.

Figure 4:
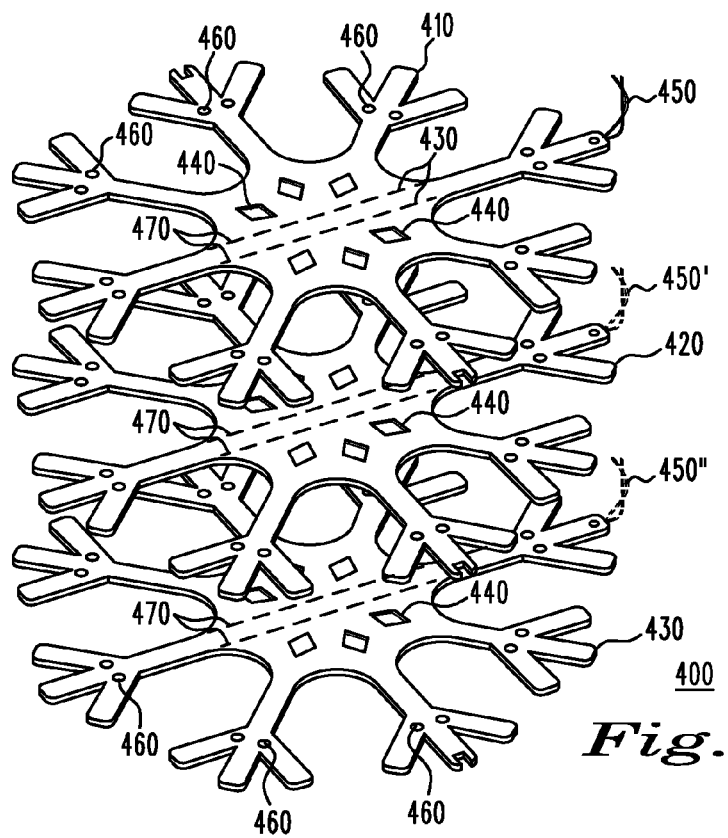
FIG. 4 is an exploded view of a three-dimensional lighting structure in accordance with certain embodiments.

FIG. 4 is an exploded view of a three-dimensional lighting structure 400 in accordance with certain embodiments. This view illustrates what an exemplary three-dimensional lighting structure might look like and is presented as an aesthetically pleasing snowflake shape. It can be seen that the folding elements 470, shown as center folding creases, or slotting, perforations, etc. in the middle of the design are evident, as are the perforated patterns 440 repeated in each sheet 410, 420, 430 of the three-dimensional lighting structure. While the perforations 440 in this example are shown as diamond shaped, any size or shape may be utilized and may have a positive impact on three-dimensional lighting structure performance. For example, as the size of the perforations increases, the amount of wind resistance offered by the three-dimensional lighting structure lessens.

The power cord 450 is clearly shown going to each layer or sheet of light active material 410, 420, 430, as are the dashed representations of same 450', 450" for the bottom two layers indicates that they may either be powered separately or together with the top layer. Either way, when power is provided to the light active material of the sheets via power cord 450, the lighting of every layer is powered. Power cord 450 (450', 450") provides electrical power to the discrete lighting elements of the light active technology material, whether they be OLEDs or ILEDs, for example. The discrete lighting elements of the light active technology material are denoted by reference number 460.

Figure 5:
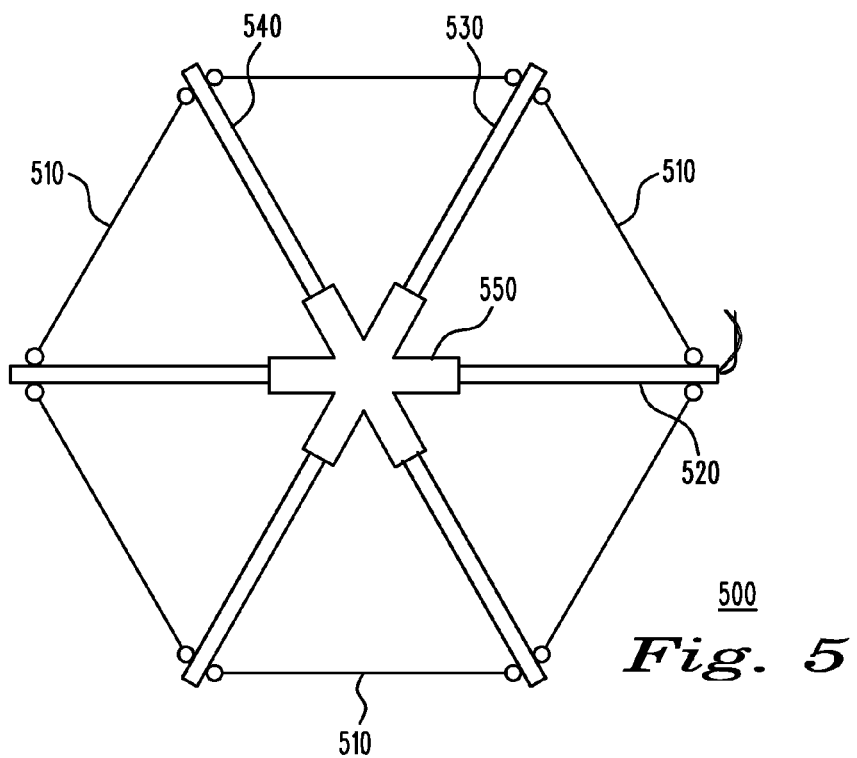
FIG. 5 is a bottom view of a three-dimensional lighting structure in accordance with certain embodiments.

FIG. 5 is a bottom view of a three-dimensional lighting structure 500 in accordance with certain embodiments. In this view, a chain shape maintainer or fastening element 510 around the periphery of the three-dimensional lighting structure to hold the three sheets of light active material 520, 530, 540 open in position is evident. At the center, the use of an optional end clip 550, a fastening element useful for maintaining the desired three-dimensional shape of the three-dimensional lighting structure while open, is shown. It is noted here that only three sheets of light active material 520, 530, 540 are shown, but any number of sheets may be used within the spirit and scope of the invention. Fastening element 550 may be made of plastic or other substantially rigid material. As a shape retainer, end clip 550 accepts the ends of sheets 520, 530, 540 as shown into grooves into which the sheets may snugly fit.

Figure 6:
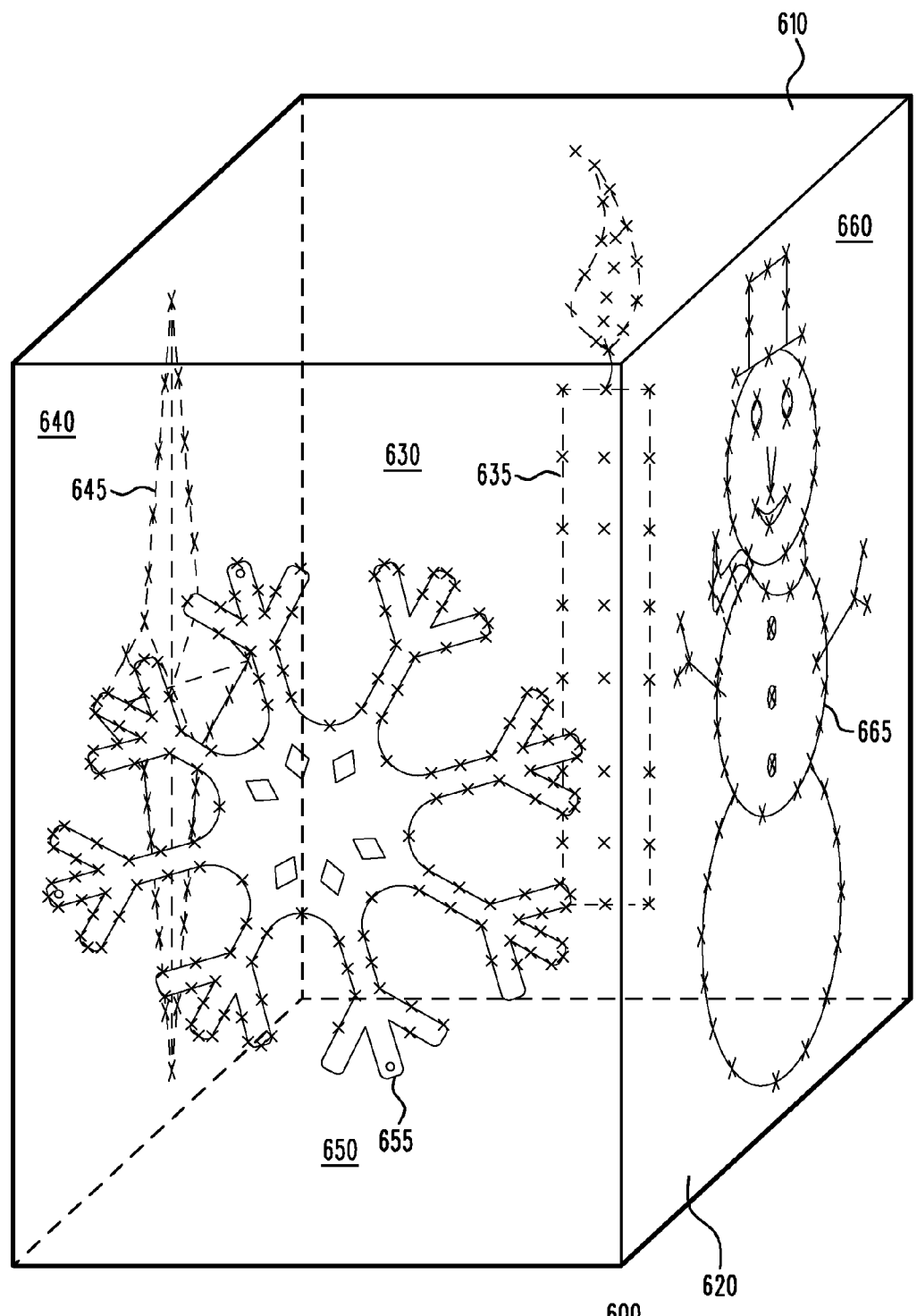
FIG. 6 is a rectangular three-dimension lighting structure in accordance with certain embodiments.

Referring now to FIG. 6, an exemplary rectangular shaped three-dimensional lighting structure 600 is illustrated, in accordance with various embodiments. This ornament 600 has six sides: a top 610, a bottom 620, a back side 630 in which a candle-shaped lighting figure is shown, a left side 640 in which a star-shaped lighting figure 645 is shown, a front side 650 with a snowflake-shaped lighting figure 655, and a right side 660 in which a snowman-shaped figure 665 is shown. It can be seen that each of the four sides with patterned lighting, each has its own arrangement of lights within the side to create a unique design, whether it be a snowman, a snowflake, a star or a candle. The "x" symbols on the drawing indicate the presence of the lighting elements within the sheet (s)/ply(s) of active lighting material for a particular side of the ornament. The placement of the lighting elements to create the lighting image of a desired shape of each of the four sides may occur by appropriate placement of the lighting elements during manufacture, such as by proper placement of the elements by means of "pick and place" manufacturing or the like. And, while the shapes may be made by using the lighting elements to simply outline the desired shape, it can be seen by reference to the candle shape 635, for example, that lighting elements may be used to fill in a design as well; the lighting elements within a design may be evenly spaced or not. Moreover, the desired decorative shape may be formed by some combination of lighting and shading, such as by placement of lighting elements on a field of colored material. In this manner, the lighting may be used to simply enhance the effect of a colored or shaded portion of the active lighting material. The lighting elements employed in the three-dimensional lighting structure may themselves be of varying colors. As examples of the above, consider a painted angel may be accentuated by the placement of a halo formed by lighting elements, one or more candles enhanced by placement of lighting elements to represent candle flames, and a holiday tree with lighting elements strategically placed to yield the desired effect.

Figure 7:
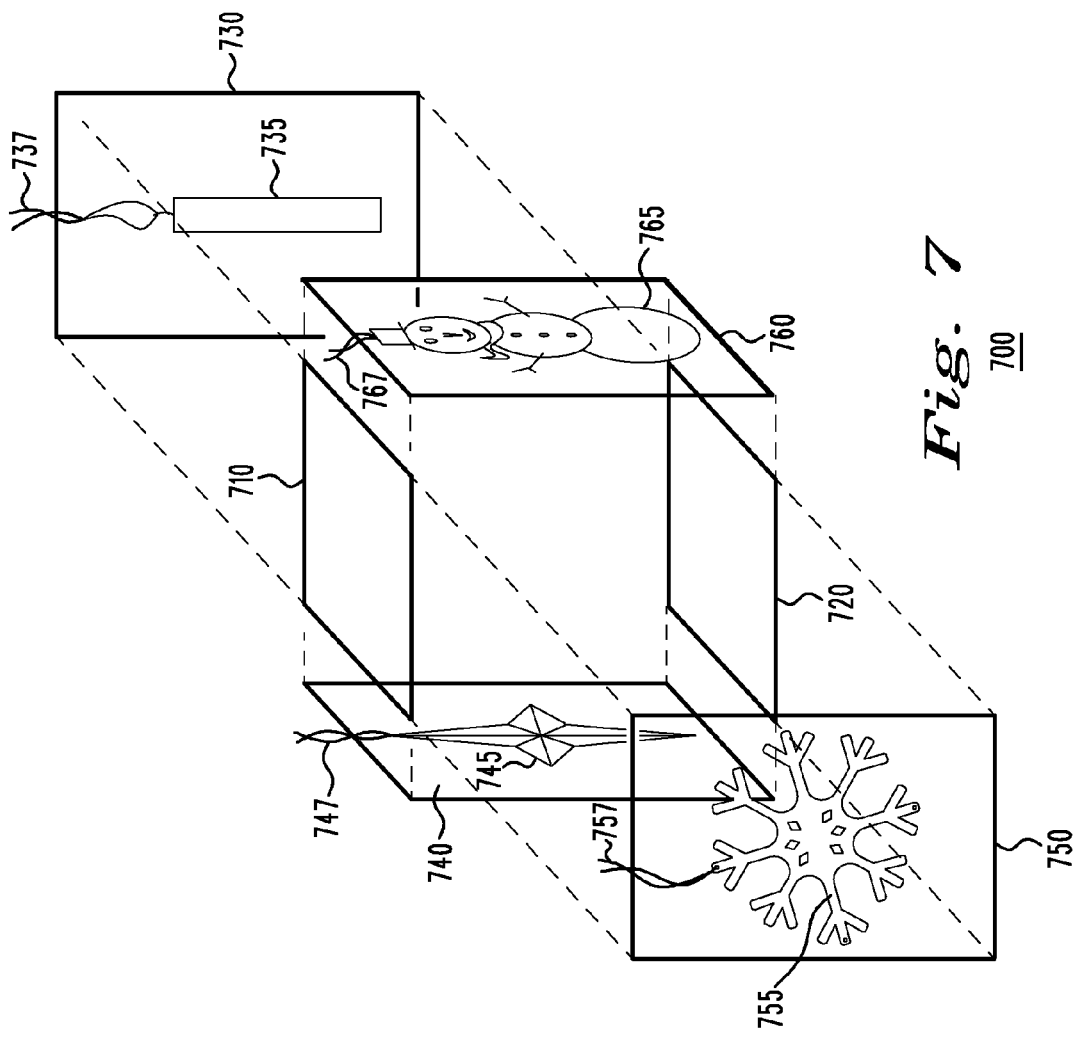
FIG. 7 is a rectangular three-dimension lighting structure comprised of multiple sheets of light active material in accordance with certain embodiments.
Figure 8:
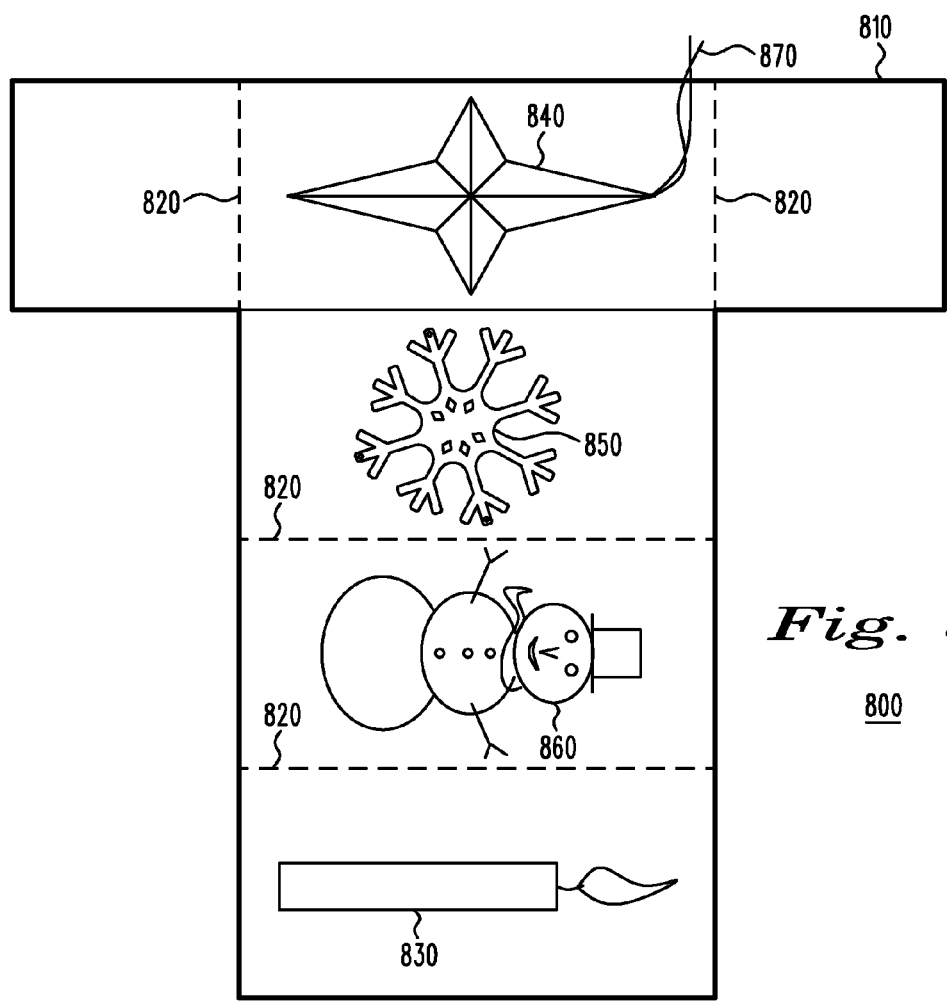
FIG. 8 is a rectangular three-dimension lighting structure comprised of a single sheet of light active material in accordance with certain embodiments.

Any given three-dimensional lighting structure may theoretically be comprised of one sheet or ply of light active material, as illustrated in FIG. 8, or multiple sheets of material, as shown in FIGS. 2, 3, 4, 5 and 7, for example. When a single sheet of light active material is used, folding of the sheet at one or more folding elements to create a three-dimensional surface together with a fastening element to hold the three-dimensional shaping into place defines a three-dimensional lighting structure.

Referring now to FIG. 7, it can be seen that the rectangular three-dimensional lighting structure 700 is comprised of six different sheets/plies of active lighting material: top 710; bottom 720; back side 730 having a candle-shaped figure 735 comprised of lighting elements powered by power cord 737; left side 740 having a star-shaped figure 745 comprised of lighting elements powered by power cord 747; front side 750 having a snowflake-shaped figure 755 comprised of lighting elements powered by power cord 757; and a right side 760 having a snowman-shaped figure 765 comprised of lighting elements powered by power cord 767. It can be seen that each separate sheet of light active material has its own power cord to power lighting elements within that particular sheet. The sheets of light active material are smaller but more power cords must be dealt with.

Conversely to FIG. 7 in which a three-dimensional lighting structure is formed from multiple sheets of material, FIG. 8 illustrates that a similarly shaped ornament may be formed from one sheet/ply of light active material. Ornament 800 is formed from a single sheet/ply 810 of light active material having various sections that when folded along folding elements 820 form a six-sided rectangular shaped, three-dimensional lighting structure with shapes 830, 840, 850, 860 as shown in FIG. 6. A particular advantage of the unitary ornament 800 is that only a single power cord is needed to power all lighting elements within the single sheet 810. It is noted that any number of sheets of light active material may be utilized to create the three-dimensional lighting structure. Thus, while FIG. 7 illustrates multiple sheets and FIG. 8 illustrates one sheet, it is understand that any number of sheets, including up to a theoretically infinite number of sheets may be employed so long as the result is a three-dimensional light active structure that retains its three-dimensional nature by means of a fastening element.

Figure 9:
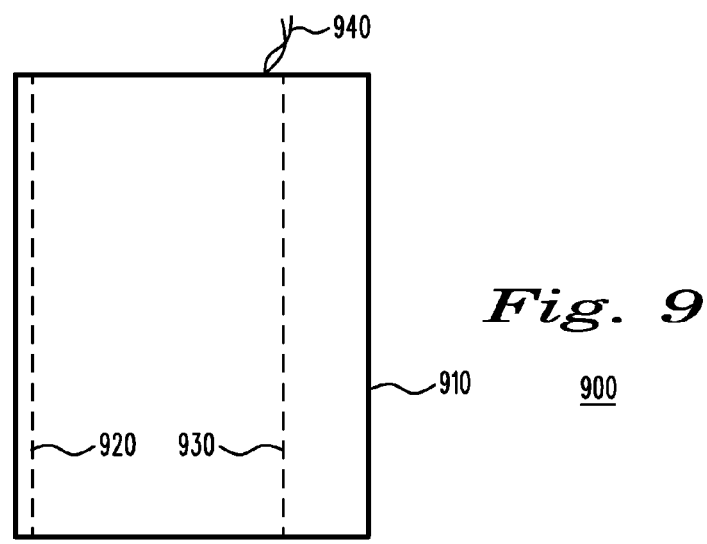
FIG. 9 is a sheet of light active material having non-centered folding elements in accordance with certain embodiments.

As previously mentioned, folding elements, such as bends, creases, perforated portions, etc. may be along the center or midline of a sheet of light active material. Top view 900 of FIG. 9 illustrates that this limitation is not a requirement of the various embodiments. Ply/sheet of light active material 910 has two folding elements, 920 and 930, both of which are off-center, not mid-line, with respect to sheet 910. It is noted that such folding elements 920 and 930 are particularly useful in the creation of non-symmetrical three-dimensional lighting structure shapes. Examples of non-symmetrical three-dimensional ornaments might include animal shapes, nature shapes (flowers, trees), etc.

Figure 10:
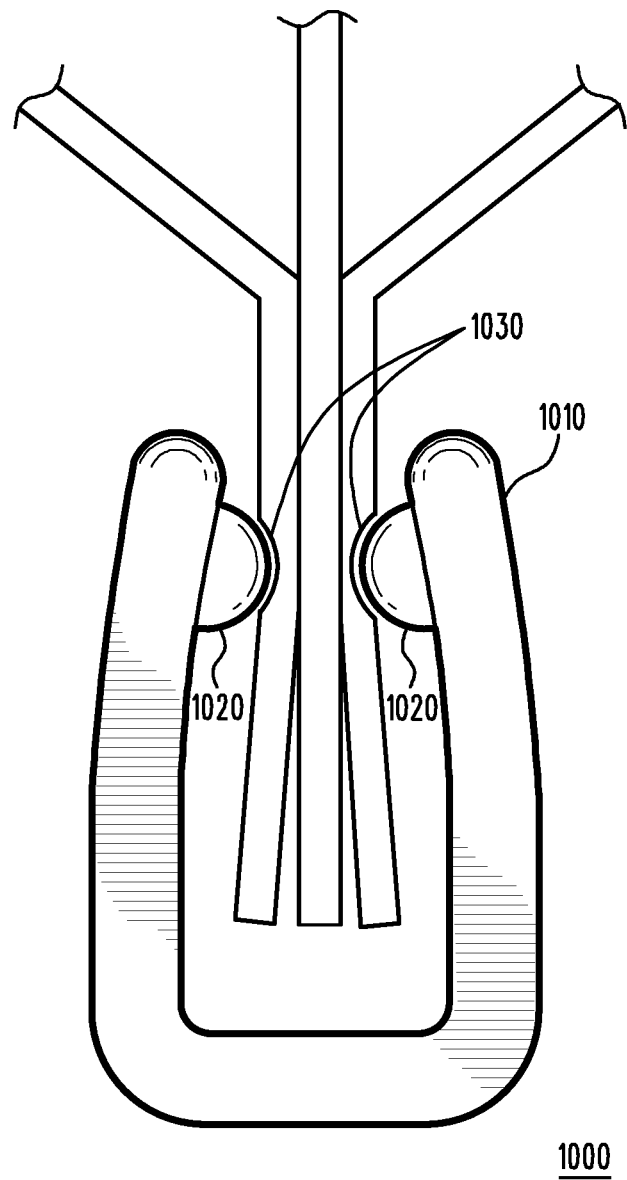
FIG. 10 is a clip assembly fastening element in accordance with certain embodiments.

While it is envisioned that a fastening element may be used to fasten together two or more sheets of light active material, it may also be used to fasten a single sheet or ply of material to itself, at appropriate fastening points to help retain three-dimensional shapes created by shaping the one or more sheets of light active material. Such might be the case, for example, where a three-dimensional shape is created from a single sheet or from a small number of sheets which are, at various locations, are self-attached or fastened. For example, consider that the petals of a flower are made from a single sheet and feature the appearance of separate, wavy petals by self-attaching the material at the start of a new petal, much like the art of origami. The folds to be affixed are folded edges of the same sheet/ply of material. The fastening element may be made of weather-resistant material, such as plastic, brass or stainless steel. And, as previously mentioned, the fastening element for fastening two or more plies/sheets of material may also be affixed to each other using a heat seal or weather-resistant fasteners, such as made of plastic, brass or stainless steel, for example; FIG. 10 illustrates a clip that may be used for this purpose. Velcro or glue may be used as a fastening element, in addition to the clips of FIGS. 5 and 10, and the beaded chain of FIGS. 2 and 5. And, FIG. 5 provides an illustration that one or more fastening elements may be used in combination; that drawing illustrates the use of a beaded chain together with an end clip.

Referring now to FIG. 10, an exemplary clip serves as a fastening element for fastening together the light active material is shown. Clip element 1000 is comprised of a unitary body portion 1010, formed as a substantially u-shaped body. Proximate either lateral end of the body portion 1010, substantially round projections, herein referred to as dimplets 1020, are formed along the inside surface of body portion 1010 and may be integral unitary body portion 1010; conversely, they may be separately formed by affixed to the inside surface of body portion 1010 as shown. Clip element 1000 fits snugly over the ends of two or more surfaces/edges of light active material and the dimplets 1010 are designed to match up with corresponding depressions 1030 found within the surface of the light active material sheet being fastened together. Here, there are three sheets/folded edges of light active material being fastened together in which the two outer sheets/folded edges of material have the depressions suitable for receiving the dimplets 1020 when clip assembly 1000 is forced over the three sheets/folded edges of material.

It is further understood that fastening elements serve to retain the three-dimensional shape of the lighting structure formed by folding/bending one or more sheets of light active material. For example, it is further envisioned that a fastening element, in addition to the clips, beaded chain and self-adhesive means discussed above, can be provided by a tab portion that can be mated with a slot portion upon folding the sheet(s) along the one or more folding element lines. The tab portion in an exemplary embodiment may be formed along an edge of one sheet of light active material. The slot portion may be formed elsewhere in the same sheet or in another sheet, but is operable to receive the tab portion when the one sheet is folded along the one or more folding elements to mate the tab portion to the slot portion. Once the tab and slot portions are mated, other fastening elements, described above, can be optionally used to strengthen the fastening/retaining function of the fastening element. Moreover, any number of slots and corresponding tabs may be used as desired.

Consider again, for example, FIGS. 8 and 9. In FIG. 8, formed of one sheet of light active material, either or both of the portions that will serve as top and bottom surfaces when the sheet is followed along folding elements 820 may operate as tab portions that may be inserted into a mating edge portion of the sheet that serves a slot function. This may be further enhanced by extending the length of the tab portion(s) to be retained within a slot edge to which it is mated. Once the tab(s) and slot(s) portions are mated, they may be further retained in place by the application of one or more additional fastening elements, such as tape, glue or velcro, that serve to bolster the retention function.

Furthermore, it may be considered that folding elements, such as perforations along which a sheet(s) may be folded may additionally serve a slot function. Consider that the dashed line that represents folding line 920 in FIG. 9 could be representative of one or more slot portions that function to receive one or more tab portions that may be mated to them by the folding process. Of course, folding the sheet along folding line 920 also may be considered to form a tab portion. And, the use of two such sheets of material as sheet 910 in this manner would demonstrate corresponding tab and slot portions.

In accordance with further example implementations, it is desired to provide increased visual impact to three-dimensional lighting structures that employ active light technology. This may be accomplished by using two sheets of light active material, which may be affixed one to the other back-to-back, such as by gluing, stapling, etc. to create a double-faced sheet of light active material in a manner that each individual sheet of light active material of the double-faced sheet of light active material radiates light in an outward facing direction so that light radiates from the front and the back of the double-faced sheet of light active material. In a thus formed double-faced sheet of light active material, the backs or backing of two opposedly facing sheets of light active material that have active lighting elements such as ILEDs or OLEDs, for example, may be attached to the other such that the lighting elements radiate outward from both the front and the back surfaces of the formed double-faced sheet of light active material. The individual sheets of light active material placed back-to-back are each non-rigid, flexible, foldable sheets of light active material, with each sheet having a number of lighting elements that are sandwiched between two or more laminate layers and have emissive electroluminescent material. Each sheet also has circuitry coupled to the light elements within. The double-faced sheet of light active material formed from two opposedly facing sheets of light active material is also non-rigid, flexible, and foldable.

A variety of techniques and material, including, but not limited to, dimple clips, staples, adhesive, laser or heat sealing or welding may be employed to attach the individual sheets of light active material together, back-to-back, to form the double-faced sheet of light active material. The folding element(s) and fastening element(s) discussed previously to fold the sheets of light active material and to retain the sheets in a three-dimensional form are still applicable to this implementation and embodiment. In a three-dimensional lighting structure, this is particularly advantageous as the amount of light radiating outward may be at least essentially doubled over the single sheet of light active material discussed previously.

A three-dimensional lighting structure made of one or more double-faced sheets of light active material is thus disclosed. A 3-D lighting structure may be formed of a single double-faced sheet of light active material, such as illustrated in FIG. 8, for example. A 3-D lighting structure may also be formed of multiple double faced sheets of light active material, as illustrated in several of the drawings, including FIGS. 11-16.

Figure 11:
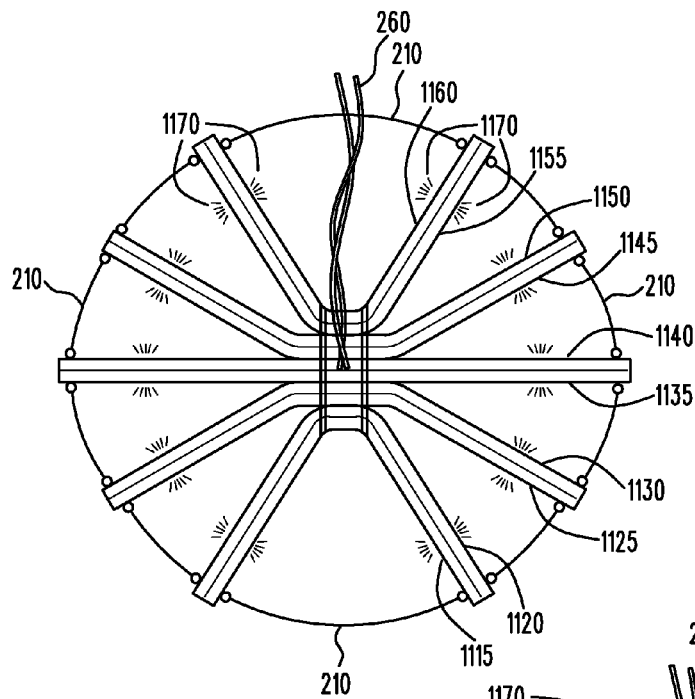
FIGS. 11 and 12 are top views of a three-dimensional lighting structure assembly made of double-faced sheets of light active material, in accordance with certain embodiments.

Reference to FIGS. 11-16 illustrate double-faced sheets of light active material in three-dimensional lighting structures. Referring now to FIG. 11, a three-dimensional lighting structure 1100 having five double-faced sheets of light active material is illustrated. A first double-faced sheet of light active material is formed by two individual sheets 1115, 1120 attached to one another back-to-back, opposedly facing, so that light 1170 radiates from both sides of the double-faced sheet as shown. A second double-faced sheet of light active material is formed by two individual sheets 1125, 1130 attached to one another back-to-back so that light 1170 radiates from both sides of the double-faced sheet as shown. A third double-faced sheet of light active material is formed by two individual sheets 1135, 1140 attached to one another back-to-back so that light 1170 radiates from both sides of the double-faced sheet as shown. A fourth double-faced sheet of light active material is formed by two individual sheets 1145, 1150 attached to one another back-to-back so that light 1170 radiates from both sides of the double-faced sheet as shown. A fifth double-faced sheet of light active material is formed by two individual sheets 1155, 1160 attached to one another back-to-back so that light 1170 radiates from both sides of the double-faced sheet as shown. Bead chain 210 is used to hold the formed three-dimensional structure in place. Each of the individual sheets of a double-faced sheet of light active material, such as sheets 1115 and 1120, for example, may be adhered back-to-back such as by adhesive, heat sealing or the like. It is noted that while light 1170 radiating from both sides of the double-faced sheets is shown, not every sheet of light active material or even every double-faced sheet of light active material need be active or illuminated at any given time. For example, the active light elements may flash on or off, or in some sequence, for example.

Figure 12:
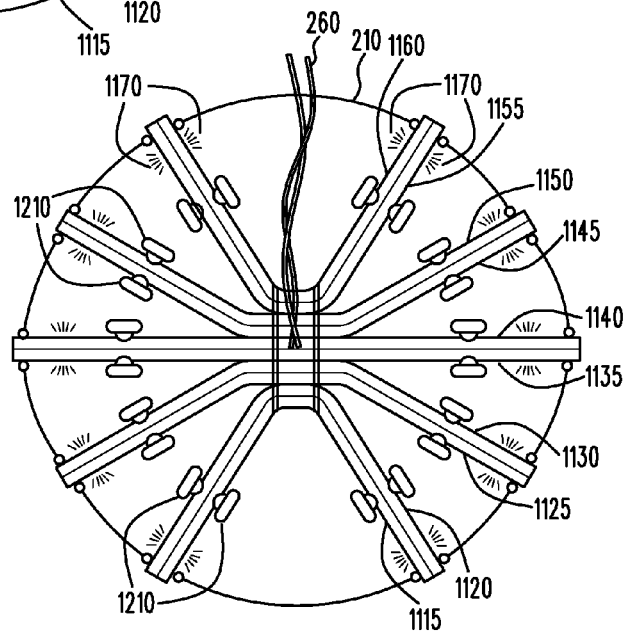

FIG. 12 illustrates another example implementation in which the individual light active sheets that form a double-faced sheet of light active material three-dimensional lighting structure 1200 may be coupled together, back-to-back with light active lighting elements radiating outward 1170 from both sides of the formed double-faced sheet of light active material, by clips, such as those also previously described in connection with FIG. 10. In this embodiment, dimple clips 1210 are used to attach the two individual sheets 1115, 1120, 1125, 1130, 1135, 1140, 1145, 1150 together, back-to-back, and to retain this attachment. The individual sheets may further also be attached one to the other by the use of adhesive, staples, laser or heat welding if needed or desired.

Figure 13:
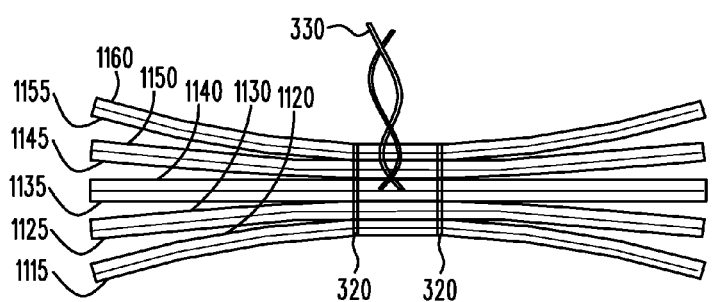
FIG. 13 illustrates storage of a three-dimensional lighting structure made of double-faced sheets of light active material, in accordance with certain embodiments.

Reference to FIG. 13 illustrates a view of a collapsed lighting structure 1300 formed of a number of double-faced sheets of light active material. The five double-faced sheets of light active material, such as those illustrated in FIG. 11 or FIG. 12, after removal of the beaded "chain" shape maintainer/fastening element 210 and clip elements 1210, for example, may be collapsed and sandwiched down into a smaller version or a less voluminous shape for storage, due to the use of flexible active lighting and the corresponding absence of a rigid frame structure. The folding element creases 320, perforations at the center of the structure, are the locations at which folding of the sheets 230, 235, 245, 250 occurs, and are still visible, as indicated by the parallel, vertical lines shown in the center. Power cord 330 is used to provide power to the plies or sheets of light active material.

Figure 14:
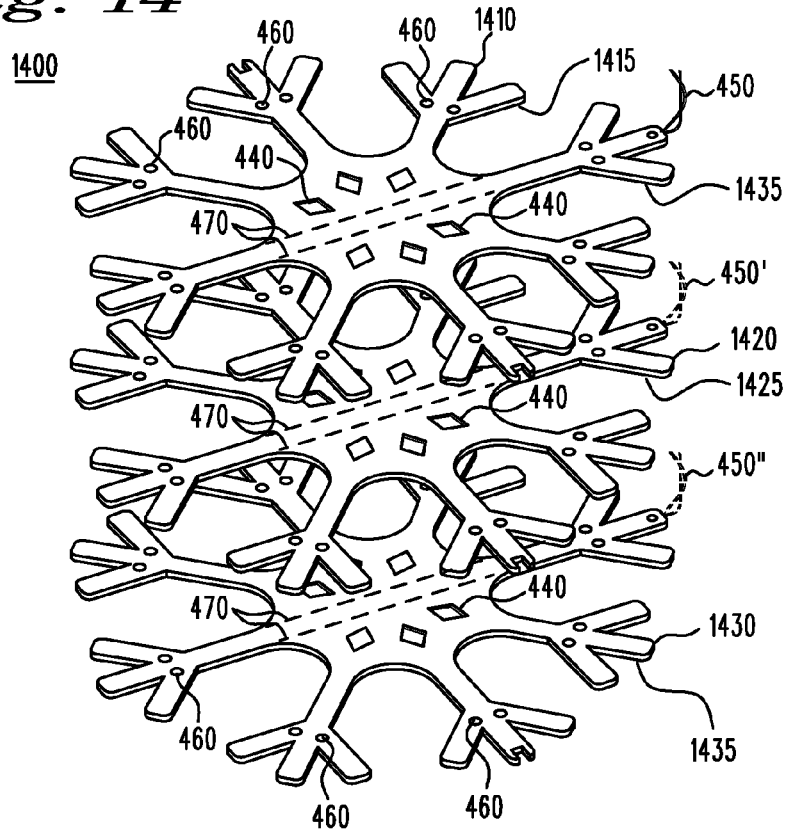
FIG. 14 is an exploded view of a three-dimensional lighting structure made of double-faced sheets of light active material, in accordance with certain embodiments.

FIG. 14 is an exploded view of a three-dimensional lighting structure 1400 having three double-faced sheets of light active material, in accordance with certain implementations.

In this example, a first double-faced sheet of light active material is formed by two individual sheets 1410 (top sheet), 1415 (bottom sheet) attached to one another back-to-back so that light may radiate from both sides of the double-faced sheet when the lighting elements are active. A second double-faced sheet of light active material is formed by two individual sheets 1420 (top sheet), 1425 (bottom sheet) attached to one another back-to-back so that light may radiate from both sides of the double-faced sheet when the lighting elements are active. A third double-faced sheet of light active material is formed by two individual sheets 1430 (top sheet), 1435 (bottom sheet) attached to one another back-to-back so that light may radiate from both sides of the double-faced sheet when the lighting elements are active.

This view illustrates what an exemplary three-dimensional lighting structure that employs double-faced sheets of light active material might look like and is presented as an aesthetically pleasing snowflake shape. It can be seen that the folding elements 470, shown as center folding creases, or slotting, perforations, etc. in the middle of the design are evident, as are the perforated patterns 440 repeated in each of the three sheets of the three-dimensional lighting structure. While the perforations 440 in this example are shown as diamond shaped, any size or shape may be utilized and may have a positive impact on three-dimensional lighting structure performance. For example, as the size of the perforations increases, the amount of wind resistance offered by the three-dimensional lighting structure lessens.

The power cord 450 may be used to power each layer or sheet of light active material 1410, 1415, 1420, 1425, 1430, 1435; power cords 450', 450" may also be used to power the bottom two double-faced light active layers formed of individual layers 1420, 1425 and 1430, 1435, respectively. Either way, when power is provided to the light active material of the double-faced sheets of light active material, the lighting of every layer may be powered and light radiates from both sides of the double-faced sheets of light active material. Power cord 450 (450', 450") provides electrical power to the discrete lighting elements of the individual sheets of light active technology material, whether they be OLEDs or ILEDs, for example. The discrete lighting elements of the light active technology material are denoted by reference number 460.

Figure 15:
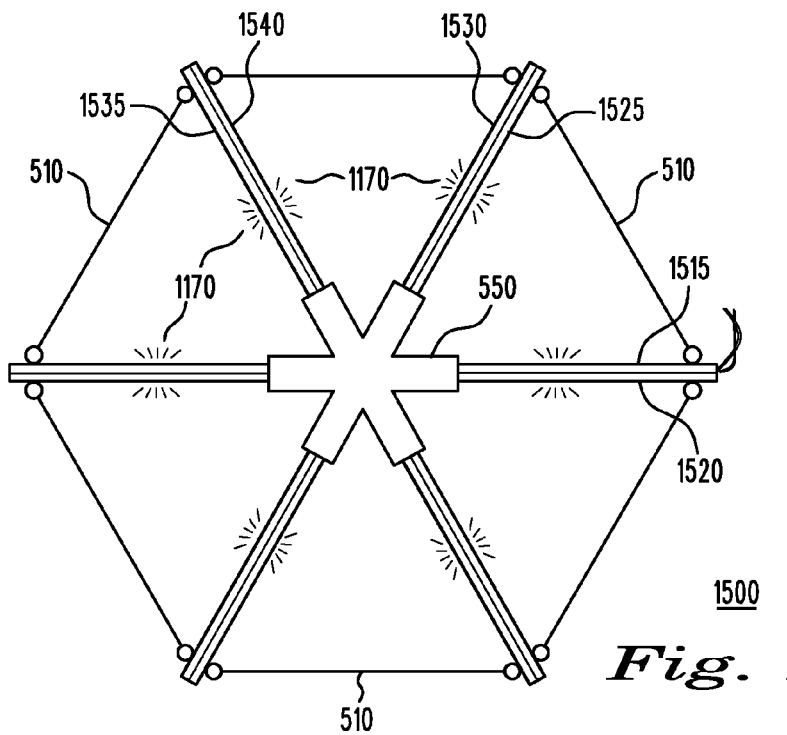
FIGS. 15 and 16 are bottom views of a three-dimensional lighting structure made of double-faced sheets of light active material, in accordance with certain embodiments.
Figure 16:
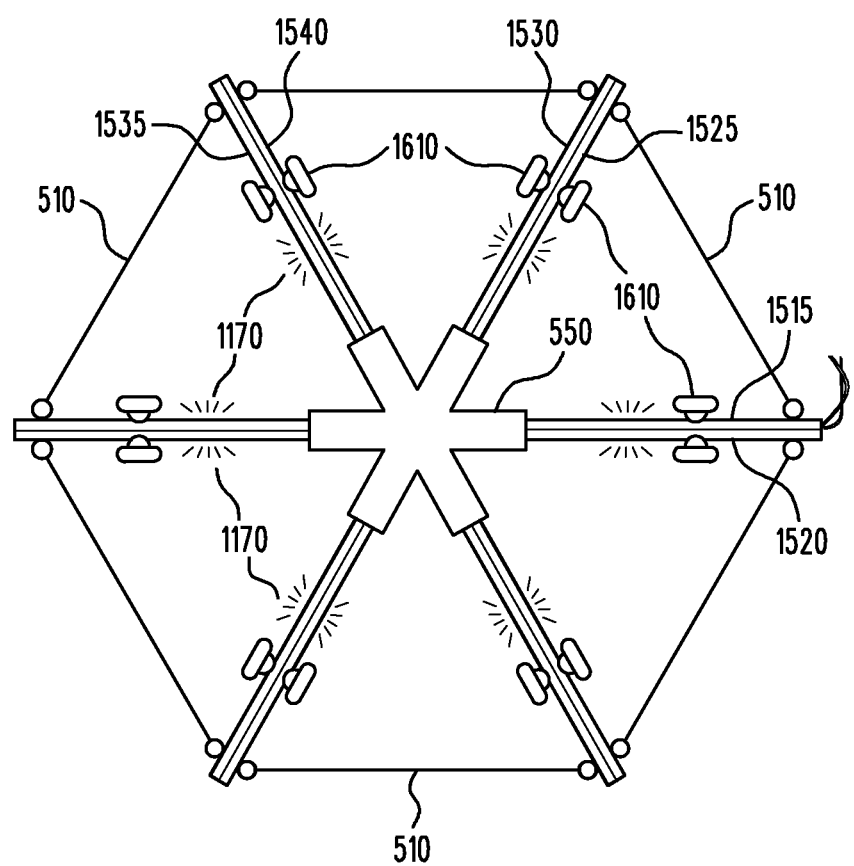

FIGS. 15 and 16 illustrate bottom views of three-dimensional lighting structures 1500 and 1600 formed of double-faced sheets of light active material, in accordance with certain implementations and embodiments. In FIG. 15, a chain shape maintainer or fastening element 510 around the periphery of the three-dimensional lighting structure to hold the three double-faced sheets of light active material (formed of individual sheets 1515, 1520, 1525, 1530, 1535, 1540 as shown) open in the three-dimensional structure formed. At the center, the use of an optional end clip 550, a fastening element useful for maintaining the desired three-dimensional shape of the three-dimensional lighting structure while open, is shown. It is noted here that only three doubled-faced sheets of light active material are shown, but any number of double-faced light active sheets may be used within the spirit and scope of the invention. Fastening element 550 may be made of plastic or other substantially rigid material. As a shape retainer, end clip 550 accepts the ends of sheets 1515, 1520, 1525, 1530, 1535, 1540 as shown into grooves into which the sheets may snugly fit. Light 1170 radiating out both sides of each double-faced sheet of light active material is illustrated. Further, in FIG. 16, clips 1610, such as dimple clips discussed previously in connection with FIGS. 10 and 12, may be used to affix or attach and retain together the two individual sheets or plys of light active material that make up a double-faced sheet of light active material. It is noted that not every double-faced sheet needs to employ a clip 1610 to secure the two sheets of light active material.

From the foregoing, it can be seen that consistent with certain implementations, a three-dimensional lighting structure may have one or more one non-rigid, flexible, foldable double-faced sheets of light active material, with each double-faced sheet of light active material formed of two oppositely facing sheets of light active material arranged back-to-back and configured to emit light from front and back sides of the one double-faced sheet of light active material. As previously discussed, each of the two oppositely facing sheet of light active material has lighting elements that are sandwiched between two or more laminate layers and that have emissive electroluminescent material and have circuitry coupled to the plurality of light elements within. Further, one or more folding elements are coupled to the double-faced sheet(s) of light active material, with a collapsible three-dimensional lighting structure formed of the double-faced sheet(s) of light active material and the at least one folding element. A power supply element to provide power to the circuitry is coupled to the lighting elements of the two oppositely facing sheets of light active material. A fastening element is coupled to the double-faced sheet(s) of light active material at at least one fastening point of the double-faced sheet(s) of light active material and removably retains the collapsible three-dimensional lighting structure in a three-dimensional form.

Also, consistent with certain implementations, a three-dimensional lighting structure may be created by: folding at least one non-rigid, flexible, foldable double-faced sheet of light active material formed of two oppositely facing sheets of light active material arranged back-to-back and configured to emit light from front and back sides of the at least one double-faced sheet of light active material along at least one folding element to create a collapsible three-dimensional lighting structure, with each of the two oppositely facing sheets of light active material having lighting elements that are sandwiched between two or more laminate layers and that have emissive electroluminescent material and each of the two oppositely facing sheets of light active material having circuitry coupled to the light elements; and removably retaining the three-dimensional lighting structure by activating a fastening element to retain the three-dimensional lighting structure created by folding the at least one double-faced sheet of light active material along the at least one folding element.

A method of manufacture of a three-dimensional lighting structure formed of one or more double-faced sheets of light active material includes: providing at least one non-rigid, flexible, foldable double-faced sheet of light active material formed of two oppositely facing sheets of light active material arranged back-to-back and configured to emit light from front and back sides of the at least one double-faced sheet of light active material, with each of the two oppositely facing sheets of light active material having lighting elements that are sandwiched between two or more laminate layers and that have emissive electroluminescent material and each of the two oppositely facing sheets of light active material having circuitry coupled to the lighting elements; providing the at least one non-rigid, flexible, foldable double-faced sheet of light active material with at least one folding element along which the double-faced sheet of light active material is foldable; and providing a fastening element to removably retain a collapsible three-dimensional lighting structure created when the double-faced sheet of light active material is folded along the at least one folding element.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A three-dimensional lighting structure, comprising:
    at least one non-rigid, flexible, foldable double-faced sheet of light active material comprised of two opposedly facing sheets of light active material arranged back-to-back and configured to emit light from front and back sides of the at least one double-faced sheet of light active material,
    with each sheet of the two opposedly facing sheets of light active material having a plurality of lighting elements that are sandwiched between two or more laminate layers and that comprise emissive electroluminescent material and having circuitry coupled to the plurality of light elements within;
    at least one folding element of the at least one double-faced sheet of light active material, with a collapsible three-dimensional lighting structure formed of the at least one double-faced sheet of light active material and the at least one folding element;
    a power supply element to provide power to the circuitry coupled to the plurality of lighting elements of the two opposedly facing sheets of light active material of the at least one double-faced sheet of light active material; and
    a fastening element coupled to the at least one double-faced sheet of light active material at at least one fastening point of the at least one double-faced sheet of light active material, wherein the collapsible three-dimensional lighting structure is removably retained in a three-dimensional form by the fastening element.

2. The lighting structure of claim 1, wherein the two opposedly facing sheets of light active material comprise a plurality of organic light emitting diode (OLED) lighting elements.

3. The lighting structure of claim 1, wherein the two opposedly facing sheets of light active material comprise a plurality of inorganic light emitting diode (ILED) lighting elements.

4. The lighting structure of claim 1, wherein the fastening element comprises a bead chain.

5. The lighting structure of claim 1, wherein the fastening element comprises a clip element.

6. The lighting structure of claim 5, wherein the clip element further comprises:
    a substantially u-shaped unitary body portion having two opposedly positioned lateral ends; and
    first and second dimplet portions, the first dimplet portion positioned along a first interior surface at a first lateral end of the unitary body portion and the second dimplet portion positioned along a second interior surface at a second lateral end of the unitary body portion in oppositional proximity to one another.

7. The lighting structure of claim 5, wherein the fastening element comprises an end clip having a plurality of grooves into which corresponding ones of a plurality of edges of the at least one sheet of light active material fit snugly.

8. The lighting structure of claim 1, wherein the fastening element is a self-adhesive adhesive element.

9. The lighting structure of claim 1, further comprising a folding element retention element that retains in position a fold of the at least one double-faced sheet along the at least one folding element.

10. The lighting structure of claim 9, wherein the folding element retention element comprises a heat or laser weld of the at least one double-faced sheet along the at least one folding element.

11. The lighting structure of claim 9, wherein the folding element retention element comprises a mechanical attachment along the at least one folding element.

12. The lighting structure of claim 11, wherein the mechanical attachment comprises staples along the at least one folding element.

13. The lighting structure of claim 11, wherein the mechanical attachment comprises glue along the at least one folding element.

14. The lighting structure of claim 11, wherein the mechanical attachment comprises a self-adhesive fastener along the at least one folding element.

15. The lighting structure of claim 1, wherein the three-dimensional lighting structure is formed from one double-faced sheet of light active material comprising first and second oppposedly facing sheets of light active material arranged back-to-back and configured to emit light from front and back sides of the one double-faced sheet of light active material, the first and second opposedly facing sheets of light active material housing the plurality of lighting elements, having a plurality of folding elements, and the power supply element is a single power cord that provides power to the plurality of lighting elements.

16. The lighting structure of claim 15, wherein the fastening element further comprises:
    a tab portion formed along an edge of the one double-faced sheet of light active material;
    a slot portion of the one double-faced sheet to receive the tab portion when the one double-faced sheet is folded along the at least one folding element to mate the tab portion to the slot portion.

17. The lighting structure of claim 1, wherein the three-dimensional lighting structure comprises a plurality of double-faced sheets of light active material each formed of first and second opposedly facing sheets of light active material arranged back-to-back and configured to emit light from front and back sides of the double-faced sheet of light active material, with each of first and second opposedly facing sheets of light active material having a plurality of lighting elements and configured to be powered by a power cord of the power supply element.

18. The lighting structure of claim 1, wherein removal of the fastening element permits the at least one double-faced sheet of the light active material of the three-dimensional lighting structure to collapse into a substantially two-dimensional form.

19. The lighting structure of claim 1, wherein a back of each of the two opposedly facing sheets of light active material are attached to form the at least one double-faced sheet of light active material.

20. A method of creating a three-dimensional lighting structure, comprising:
    folding at least one non-rigid, flexible, foldable double-faced sheet of light active material formed of two opposedly facing sheets of light active material arranged backto-back and configured to emit light from front and back sides of the at least one double-faced sheet of light active material along at least one folding element to create a collapsible three-dimensional lighting structure, with each of the two opposedly facing sheets of light active material comprising a plurality of lighting elements that are sandwiched between two or more laminate layers and that comprise emissive electroluminescent material and each of the two opposedly facing sheets of light active material having circuitry coupled to the plurality of light elements; and removably retaining the three-dimensional lighting structure by activating a fastening element to retain the three-dimensional lighting structure created by folding the at least one double-faced sheet of light active material along the at least one folding element.

21. The method of claim 20, further comprising:
providing power to the circuitry coupled to the plurality of lighting elements of the two opposedly facing sheets of light active material of the at least one double-faced sheet of light active material.

22. The method of claim 20, powering the lighting elements of the two opposedly facing sheets of light active material of the at least one double-faced sheet with a power supply element.

23. The method of claim 20, further comprising:
collapsing the three-dimensional lighting structure into a substantially two-dimensional by de-activating the fastening element.

24. A method of manufacturing a three-dimensional lighting structure, comprising:
providing at least one non-rigid, flexible, foldable double-faced sheet of light active material formed of two opposedly facing sheets of light active material arranged back-to-back and configured to emit light from front and back sides of the at least one double-faced sheet of light active material, with each of the two opposedly facing sheets of light active material comprising a plurality of lighting elements that are sandwiched between two or more laminate layers and that comprise emissive electroluminescent material and each of the two opposedly facing sheets of light active material having circuitry coupled to the plurality of light elements;

providing the at least one non-rigid, flexible, foldable double-faced sheet of light active material with at least one folding element along which the at least one non-rigid, flexible, foldable double-faced sheet of light active material are foldable; and providing a fastening element to removably retain a collapsible three-dimensional lighting structure created when the at least one double-faced sheet of light active material are folded along the at least one folding element.

25. The method of claim 24, further comprising:
sealing the edges of the at least one non-rigid, flexible, foldable double-faced sheet of light active material.

* * * * *